(12) United States Patent
Loopstra et al.

(10) Patent No.: US 7,136,214 B2
(45) Date of Patent: Nov. 14, 2006

(54) ACTIVE FACETED MIRROR SYSTEM FOR LITHOGRAPHY

(75) Inventors: Erik Loopstra, Heeze (NL); Stephen Roux, New Fairfield, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 10/986,076

(22) Filed: Nov. 12, 2004

(65) Prior Publication Data

US 2006/0103908 A1  May 18, 2006

(51) Int. Cl.
    *G02B 26/00* (2006.01)
(52) U.S. Cl. .................. 359/290; 359/291; 359/223; 359/224
(58) Field of Classification Search .......... 359/846
    See application file for complete search history.

(56) References Cited

U.S. PATENT DOCUMENTS

| | | | | |
|---|---|---|---|---|
| 4,100,576 A | * | 7/1978 | Ditthardt | 369/44.17 |
| 4,959,531 A | * | 9/1990 | Marino | 250/201.9 |
| 5,339,346 A | | 8/1994 | White | |
| 5,469,302 A | * | 11/1995 | Lim | 359/846 |
| 5,512,759 A | | 4/1996 | Sweatt | |
| 5,631,721 A | | 5/1997 | Stanton et al. | |
| 5,677,939 A | | 10/1997 | Oshino | |
| 5,828,485 A | * | 10/1998 | Hewlett | 359/291 |
| 6,195,201 B1 | | 2/2001 | Koch et al. | |
| 6,220,561 B1 | * | 4/2001 | Garcia | 248/487 |
| 6,600,591 B1 | * | 7/2003 | Anderson et al. | 359/291 |
| 6,658,084 B1 | | 12/2003 | Singer | |
| 6,735,008 B1 | * | 5/2004 | Brophy et al. | 359/245 |
| 6,738,177 B1 | * | 5/2004 | Gutierrez et al. | 359/298 |
| 2002/0109903 A1 | * | 8/2002 | Kaeriyama | 359/290 |
| 2003/0223677 A1 | * | 12/2003 | Wendland, Jr. | 385/18 |
| 2003/0227603 A1 | * | 12/2003 | Dierichs | 355/47 |

* cited by examiner

*Primary Examiner*—Mark A. Robinson
*Assistant Examiner*—Scott Stephens
(74) *Attorney, Agent, or Firm*—Sterne, Kessler, Goldstein & Fox PLLC

(57) ABSTRACT

An active faceted mirror system is disclosed. The active faceted mirror system includes a set of active facet mirror devices, a base plate and a set of pins for mounting the active facet mirror devices to the base plate. Each of the active facet mirror devices includes a mirror substrate with a reflective surface and a bearing hole on the reverse side for mounting. Additionally, each of the active facet mirror devices includes at least three actuator targets located on the back side of the mirror substrate, a jewel bearing and a flexure for supporting the mirror substrate. The base plate includes a series of bearing holes for mounting the active facet mirror devices and at least three actuators for each of the active facet mirror devices. A set of facet controllers located on the base plate can be used to control the positioning of the active facet mirror devices to produce a desired illumination effect.

21 Claims, 7 Drawing Sheets

ACTIVE FACETED MIRROR SYSTEM FOR LITHOGRAPHY

BACKGROUND OF THE INVENTION

1. Field of the Invention

The present invention relates to lithography, and more particularly, to an active faceted mirror system.

2. Background of Invention

Lithography is often used in the manufacture of many devices and in particular, electronic and semiconductor devices, flat panel displays, print heads, micro/nano fluidic devices and the like. In a lithographic process, an image is projected onto a photosensitive substrate. As the element or feature size (hereinafter referred to as "feature size") desired to be imaged on the photosensitive substrate becomes smaller, technical problems often arise. One of these problems is providing illumination, so that its image can be projected onto the photosensitive substrate. As the feature sizes of semiconductor devices becomes smaller, there is a need for photolithographic systems that provide a resolution of less than 0.065 micrometers. In order to achieve the imaging of these relatively small element or feature sizes, shorter wavelengths of electromagnetic radiation must be used to project the image onto a photosensitive substrate. Accordingly, it is often necessary for lithographic systems to operate at the extreme ultraviolet (EUV) wavelengths, below 157 nanometers, and into the soft x-ray wavelengths, around 1 nanometer.

Historically, there were few illumination systems that could provide the required illumination properties for projecting the image of the reticle or mask onto a photosensitive substrate at these operating wavelengths. An illuminating system is disclosed in U.S. Pat. No. 5,339,346 entitled "Device Fabrication Entailing Plasma-Derived X-Ray Delineation" issuing to White on Aug. 16, 1994, which is herein incorporated by reference in its entirety. Therein disclosed is a condenser for use with a laser-pumped plasma source having a faceted collector lens including paired facets, symmetrically placed about an axis.

Another illumination system is disclosed in U.S. Pat. No. 5,677,939 entitled "Illuminating Apparatus" issuing to Oshino on Oct. 14, 1997, which is incorporated herein its entirety. Therein disclosed is an illumination system for illuminating an object in an arcuate pattern. The system has a reflecting mirror with a parabolic-toric body of rotation and a reflection type optical integrator having a reflecting surface for effecting the critical illumination in the meridoinal direction and a reflecting surface for effecting the Kohler illumination in the sagittal direction.

Another illumination system is disclosed in U.S. Pat. No. 5,512,759 entitled "Condenser for Illuminating A Ring Field Camera with Synchrotron Emission Light" issuing to Sweatt on Apr. 30, 1996, which is herein incorporated by reference in its entirety. Therein disclosed is a condenser comprising concave and convex spherical mirrors that collect the light beams, flat mirrors that converge and direct the light beams into a real entrance pupil of a camera, and a spherical mirror for imaging the real entrance pupil through the resistive mask and into the virtual entrance pupil of the camera.

Another illumination system is disclosed in U.S. Pat. No. 5,631,721 entitled "Hybrid Illumination System for Use in Photolithography" issuing to Stanton et al on May 20, 1997, which is herein incorporated by reference in its entirety. Therein disclosed is a multi-stage optical element, a condenser, and an array or diffractive optical element.

In some circumstances, these prior illumination systems may not provide the desired illumination and are relatively complicated. Additionally, many of these systems are relatively large, having many surfaces resulting in loss of energy. Some are also difficult to align and may require adjustment.

Another illumination system using a reflective fly's eye condenser is disclosed in U.S. Pat. No. 6,195,201 entitled "Reflective Fly's Eye Condensor for EUV Lithography" issuing to Koch et al. on Feb. 27, 2001, which is incorporated herein in its entirety. The illumination system disclosed in this patent addressed some of the shortcomings of the prior systems by providing an improved illumination system and condenser for use in the extreme ultraviolet that provides a desired irradiance over a predetermined field or area with a desired irradiance and angular distribution, pupil fill, or radiant intensity for use in photolithography. U.S. Pat. No. 6,195,201 achieved some of these improvements over existing illumination systems through the use of reflective fly's eyes, which are also known as a faceted mirrors or mirror arrays within an illumination system.

These faceted mirrors are referred to as fly's eyes because they consist of a set of many small mirrors, which can be referred to as chiclets, precisely configured on a base to achieve a desired reflection. An illumination system or condenser for use within a photolithographic system can consist of an illumination source that irradiates a first faceted mirror that reflects electromagnetic energy to a second faceted mirror. The first faceted mirror is typically referred to as field faceted mirror and the second faceted mirror is typically referred to as a pupil faceted mirror. Electromagnetic energy reflected from the pupil faceted mirror can typically be reflected through a series of optical elements to form an illumination field on a reticle or mask.

While the use of fly's eye mirrors has the potential to provide a precise mechanism to direct electromagnetic energy in an EUV photolithography system, current illumination systems using fly's eye mirror have significant shortcomings. Illumination systems using fly's eye mirrors that are contemplated typically would be contained within very expensive lithography systems. Customers that would use these lithography systems need to manufacture semiconductor devices that have a wide range of characteristics, and as such require a lithography tool that can support a wide range of illumination needs. Current illumination systems using fly's eye mirrors that are contemplated can not effectively support these wide range of needs. Because of the size and complexity of fly's eye mirrors, it is difficult to change out or adjust the mirrors within a given system to meet different manufacturing needs. Similarly, lithography systems that would have different combinations of fly's eye mirrors are expensive and can be cost prohibitive.

What is needed is an active faceted mirror system for use within a lithographic system that can cost effectively be adjusted to meet varying photolithographic manufacturing demands.

SUMMARY OF THE INVENTION

The present invention is directed to an active faceted mirror system for use in lithography tools and other applications in which electronic magnetic energy is transmitted and reflective surfaces are used to reflect the electromagnetic energy. The active faceted mirror system includes a set of active facet mirror devices, a base plate and a set of pins for mounting the active facet mirror devices to the base plate.

Each of the active facet mirror devices include a mirror substrate with a reflective surface on a front side and a bearing hole on the reverse side for mounting. Additionally, each of the active facet mirror devices include at least two actuator targets located on the back side of the mirror substrate, a jewel bearing located within the bearing hole and a flexure with spring back characteristics or return spring for supporting the mirror substrate. The base plate includes a series of bearing holes for mounting the active facet mirror devices and at least two actuators for each of the active facet mirror devices that are mounted to the base plate.

A control device transmits positioning instructions to each actuator for each of the active facet mirror devices. Upon receiving these instructions the actuators adjust the position of the mirror substrate to generate a desired illumination field.

There are numerous benefits associated with the active faceted mirror system disclosed herein. In particular, the use of the active faceted mirror system allows greater design flexibility and ease of use in that illumination fields can be easily produced by electronically adjusting the position of the individual active facet mirror devices instead of retrofitting devices with different mirrors. In general the active faceted mirror system disclosed herein when used within a lithographic system can cost effectively be adjusted to meet varying photolithographic manufacturing demands Further embodiments, features, and advantages of the invention, as well as the structure and operation of the various embodiments of the invention are described in detail below with reference to accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

Figure 1:
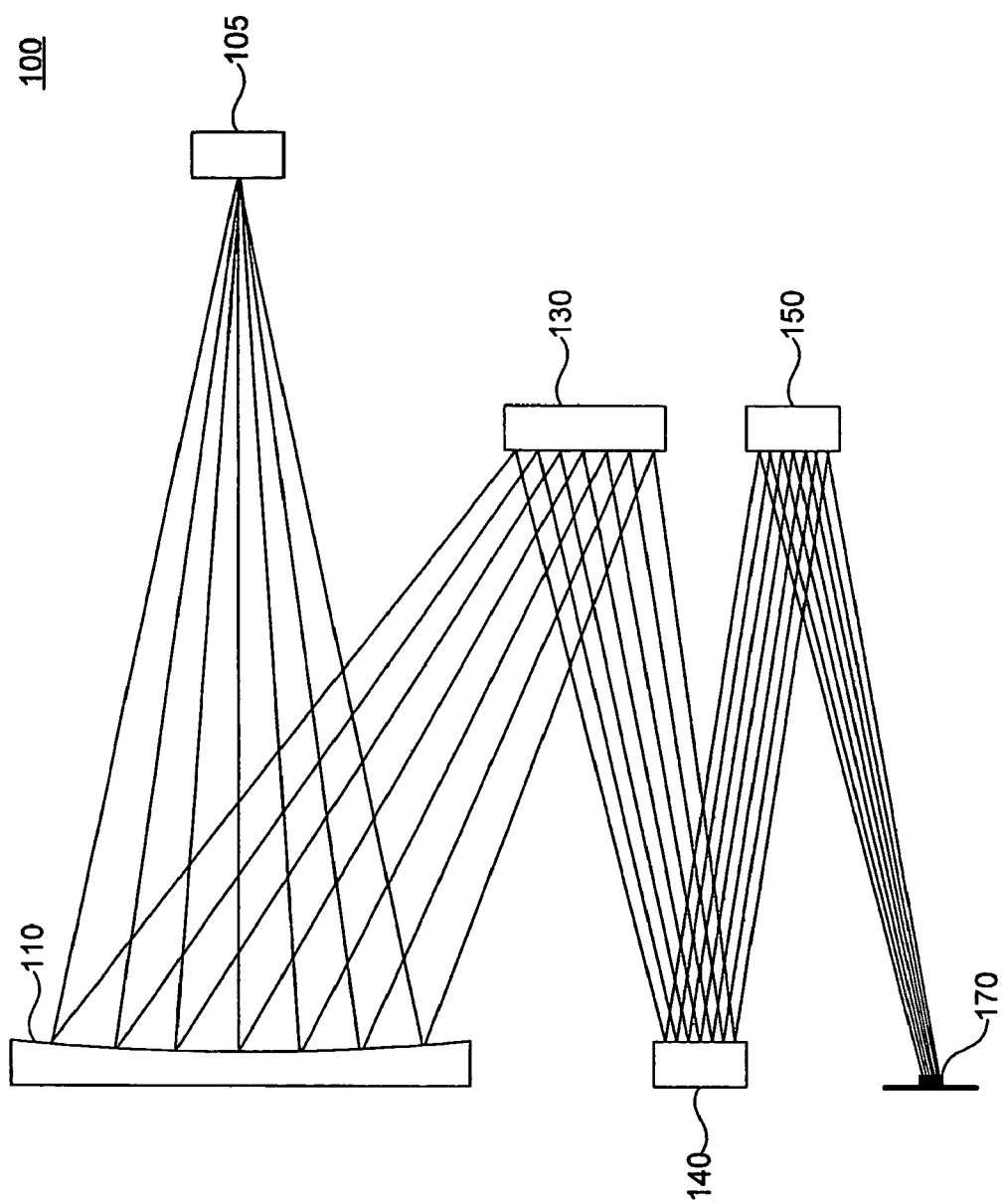
FIG. 1 is a diagram of an illumination system.

FIG. 1 illustrates illumination system 100 that uses fly's eye mirrors. Illumination system 100 includes illumination source 105, field facet mirror 110, pupil facet mirror 130, an optional first reflective element 140, and second reflective element 150.

Illumination source 105 can be a EUV source, such as a laser plasma source, a capillary discharge tube, or a synchrotron. Other types of light sources, including non-EUV sources can be used, as will be known by individuals skilled in the relevant arts. The electromagnetic radiation from illumination source 105 is collected by field facet mirror 110. Electromagnetic radiation reflected from field facet mirror 110 is collected by pupil facet mirror 130. Field facet mirror 110 has a plurality of reflective elements or mirrors, that can be referred to as chiclets or mirror facets, that are used to form a plurality of source images near the corresponding facets in pupil facet mirror 130. Electromagnetic radiation reflected from pupil facet mirror 130 is relayed by a first reflective optical element 140 and second reflective optical element 150 to an image plane or illumination field 170. In a lithography system, the combination of first and second reflective optical elements 140 and 150 relays the image of an aperture stop (not shown), located near pupil facet mirror 130 into the pupil of a projection optics system.

Figure 2:
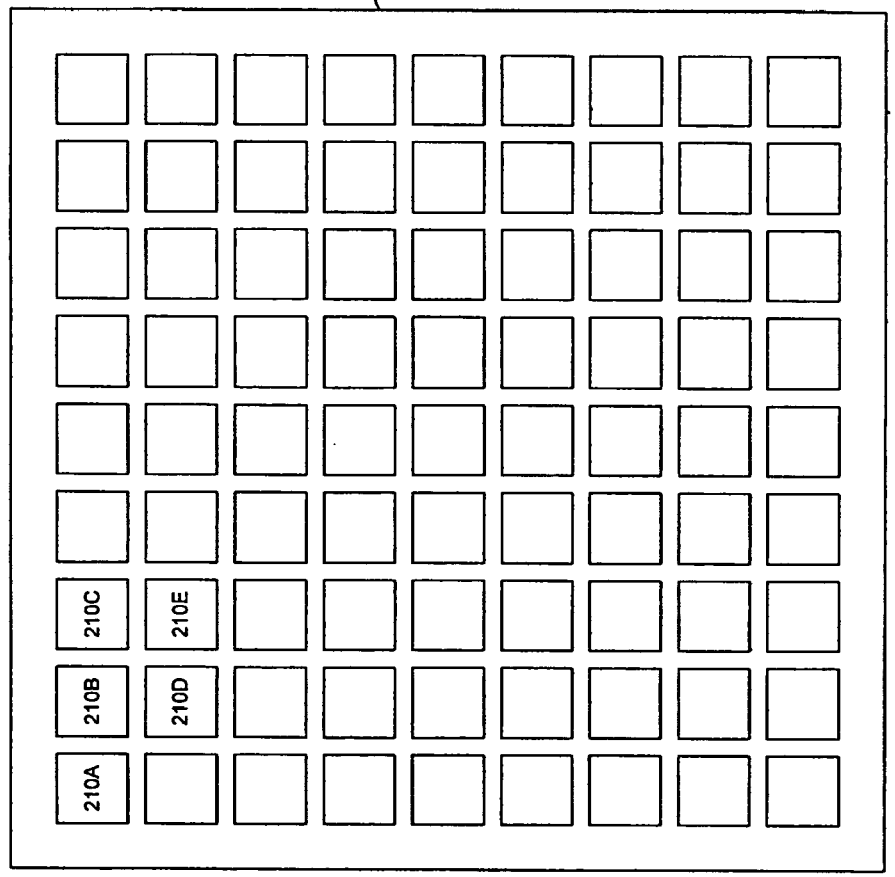
FIG. 2 is a diagram of an active faceted mirror system, according to an embodiment of the invention.

FIG. 2 provides a diagram of active faceted mirror system 200, according to an embodiment of the invention. Active faceted mirror system 200 can be used for field facet mirror 110 and/or pupil facet mirror 130 within illumination system 100. This suggested use of active faceted mirror system 200 is for illustrative purposes and not intended to limit the scope of the invention. As will be known by individuals skilled in the relevant arts based on the teachings herein, active faceted mirror system 200 can be used in a wide range of lithographic and other applications involving electromagnetic waves transmission.

Active faceted mirror system 200 includes base plate 205 and a set of active faceted mirror devices, such as active facet mirror devices 210A through 210E. In an embodiment, all remaining squares are also active facet mirror devices. In other embodiments, a mixture of fixed mirrors or reflective surfaces and active facet mirror devices can be used. As shown more completely with respect to FIG. 4, base plate 205 provides a base to mount the active faceted mirror devices. Each active faceted mirror device, such as active faceted mirror device 210A, includes a means (not shown) on its rear side to mount the active faceted mirror device to base plate 205. On the front side, the active faceted mirror device includes a reflective surface for reflecting light or other types of electromagnetic radiation, which is described below. The number of active faceted mirror devices can vary widely depending on the particular application, as will be known by individuals skilled in the relevant arts based on the teachings herein.

Figure 3:
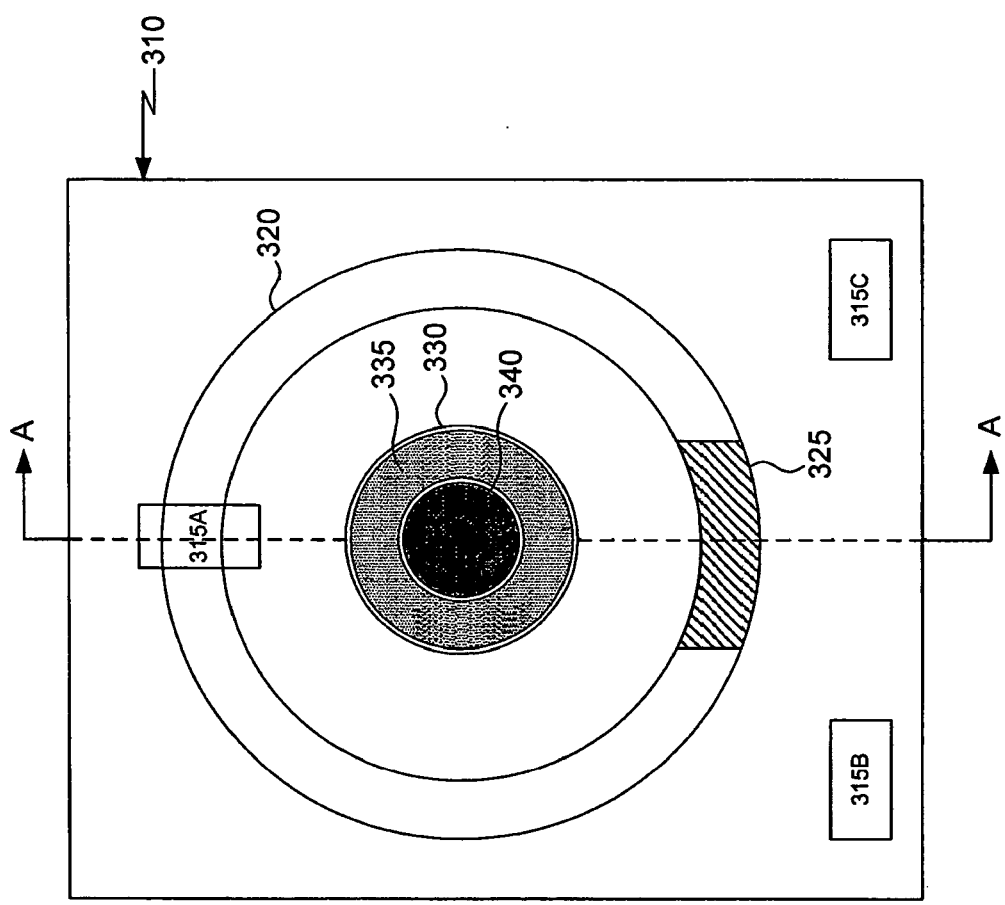
FIG. 3 is a diagram of a rear view of an active facet mirror device, according to an embodiment of the invention.

FIG. 3 provides a rear view of active facet mirror device 210 according to an embodiment of the invention. The rear view shows that active facet mirror device 210 includes mirror substrate 310, three actuator targets 315A, 315B and 315C, flexure 320, flexure pad 325, bearing hole 330, jewel bearing 335 and mounting pin 340. In an alternative embodiment, two actuator targets, such as actuator target 315A can be used. These actuator targets would be situated to provide stability and movement for active facet mirror device in conjustion with flexure 320 or a return spring. The specific locations of the two actuators will be known by individuals skilled in the relevant arts based on the teachings herein and the specification application.

Mirror substrate 310 provides a substrate to mount the positioning control elements, such as actuator targets 315A, 315B and 315C and flexure 320. Mirror substrate 310 includes bearing hole 330 located in the center of mirror substrate 310. The front side of mirror substrate 310 also provides a substrate on which a reflective surface can be placed. The reflective surface can include a mirror, a reflective coating or a layering of optical reflective coatings, as will be known by individuals skilled in the art. In addition to providing the structural support for a reflective surface and positioning elements, mirror substrate 310 also serves to dissipate heat that may build up on the reflective surface. Materials with high heat dissipating characteristics, such as silver, can be used for mirror substrate 310 to facilitate heat dissipation.

Mirror substrate 310 can range in size and dimensions based on the particular application. A typical area for a reflective surface on mirror substrate 310 is 1 cm$^2$. When used as a pupil facet mirror, the reflective surface will typically be square. When used as a field facet mirror, the reflective surface will typically be rectangular with a length that is about 5 times the width. These dimensions are exemplary, and not intended to limit the scope of the invention. In an alternative embodiment, the reflective surface can have an arcuate shape.

Actuator targets 315A, 315B and 315C are positioned about 120 degrees apart from one another relative to the center of bearing hole 330 along edges of mirror substrate 310. Optionally in the case where only two actuators are used, the flexure 320 can act as a return spring against two actuators, or dedicated springs can be added to oppose the two actuators. The actuator targets provide a surface in which an actuator, as discussed with respect to FIG. 4, can facilitate motion of active facet mirror device 210.

Flexure 320 provides a means to limit and control the motion of active facet mirror device 210. Typically, the diameter of flexure 320 is less than the width or length of mirror substrate 310. Typically, the diameter of flexure 320 will be just slightly less than the smaller of the width or length of mirror substrate 310 to provide the greatest amount of lateral stability. Flexure 320 is connected at one point under actuator target 315A to mirror substrate 310. In an embodiment, the area connected to mirror substrate 310 will be about two to five percent of the area of flexure 320. Flexure 320 also includes flexure pad 325. Flexure pad 325 is used to connect flexure 320 to a base plate, such as base plate 205. Flexure 320 and flexure pad 325 are made of silver, silicon, or other high stress yield materials that can also be used to conduct heat away from mirror substrate 310. Other materials with similar properties can be used as will be known by individuals skilled in the relevant arts based on the teachings herein.

As indicated above, mirror substrate 310 includes bearing hole 330. Bearing hole 330 is a small hole within the rear side of mirror substrate 310 to enable a pin to be inserted that will serve to support and allow for movement of mirror substrate 310. Jewel bearing 335 is glued or pressed into bearing hole 330 to facilitate smoother motion and reduce wear on bearing hole 330 within mirror substrate 310. Other fastening techniques as will be known by individuals skilled in the relevant arts can be used. Jewel bearing 335 can be made of any wear resistant, low friction material such as, but not limited to synthetic ruby, synthetic sapphire, ceramics or silicon carbide. Pin 340 is inserted into jewel bearing 335. Pin 340 can be made of, for example, silicon carbide or stainless steel. The arrangement and use of pin 340, jewel bearing 335 and bearing hole 330 are more fully described with respect to FIGS. 4 and 5. In other embodiments, bearing hole 320 is bearing surface affixed to mirror substrate 310. Alternatively, bearing hole 320 is a bearing surface directly on mirror substrate 310.

Figure 4:
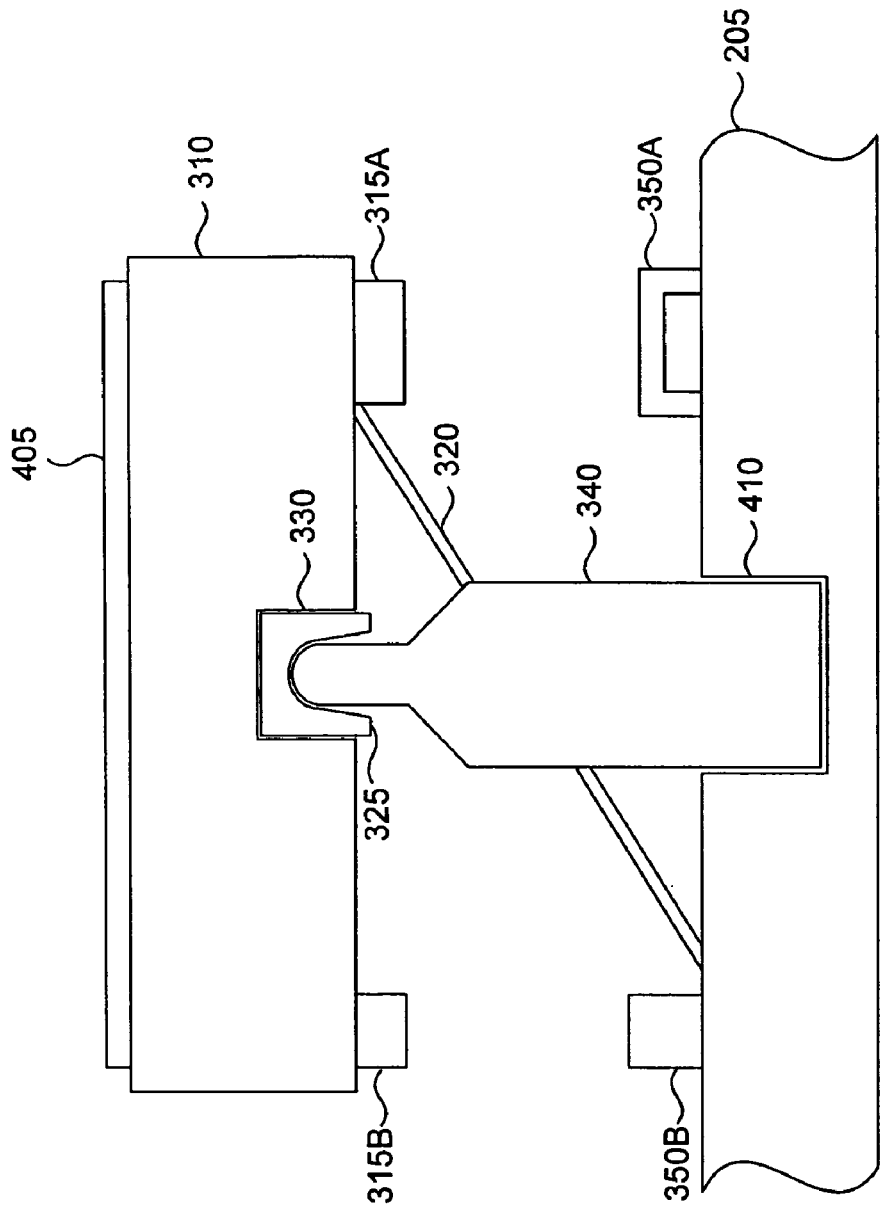
FIG. 4 is a diagram of a cross section view of an active faceted mirror system highlighting one active facet mirror device, according to an embodiment of the invention.

FIG. 4 provides a cross sectional view of a portion of an active faceted mirror system highlighting active facet mirror device 210, according to an embodiment of the invention. FIG. 4 shows a cross sectional view across cross sectional plane A illustrated in FIG. 3, that assumes that active facet mirror device is attached to base plate 205 as shown in FIG. 1. The cross sectional view shows how pin 340 resides in both base plate 205 and mirror substrate 310. As discussed above, pin 340 is positioned with jewel bearing 325 which has been pressed, for example, into mirror substrate 310. Similarly, base plate 205 includes bearing hole 410. The opposite end of pin 340 from the end that is positioned into jewel bearing 325 is glued or pressed into bearing hole 410.

The length of pin 340 will vary depending on the application and the size of the mirror substrate. Typically, the length of pin 340 will be such that the distance between mirror substrate 310 and base plate 205 will range from approximately 0.25 to 0.50 of the width mirror substrate 310. This range is exemplary and not intended to limit the invention.

Flexure 320 extends from one side of mirror substrate 310 to a point on base plate 205 that is positioned underneath a point on mirror substrate 310 that is on the opposite side of where flexure 320 is connected to mirror substrate 310. Flexure 320 can be screwed, glued, soldered or braised to base plate 205 and mirror substrate 310, as will be known by individuals skilled in the relevant arts.

Actuators 350A and 350B are mounted onto base plate 205. Actuator 350A is positioned beneath actuator target 315A, while actuator 350B is positioned beneath actuator target 315B. A third actuator, not shown in FIG. 4, would be located on base plate 205, such that it would be positioned beneath actuator target 315C. Actuators 350 can be magnetic actuators. When magnetic actuators are used, a electrical current is provided to one or more of the actuators to position the mirror substrate by forcing mirror substrate 310 to move either up or down.

In an alternative embodiment, the magnetic actuators can be self sensing magnetic bearings. The self sensing magnetic bearings, as will be known by individuals skilled in the relevant arts based on the teachings herein, can provide a signal to a control device that allows a determination of the distance between an actuator and an actuator target to be determined. In this way, the position of each active facet mirror device can be assessed and adjusted as needed. In an alternative embodiment, Lorentz actuators can be used for actuators 350.

Reflective surface 405 is coated on the front side of mirror substrate 310. In an embodiment, reflective surface 405 can be an EUV reflective surface.

Figure 5:
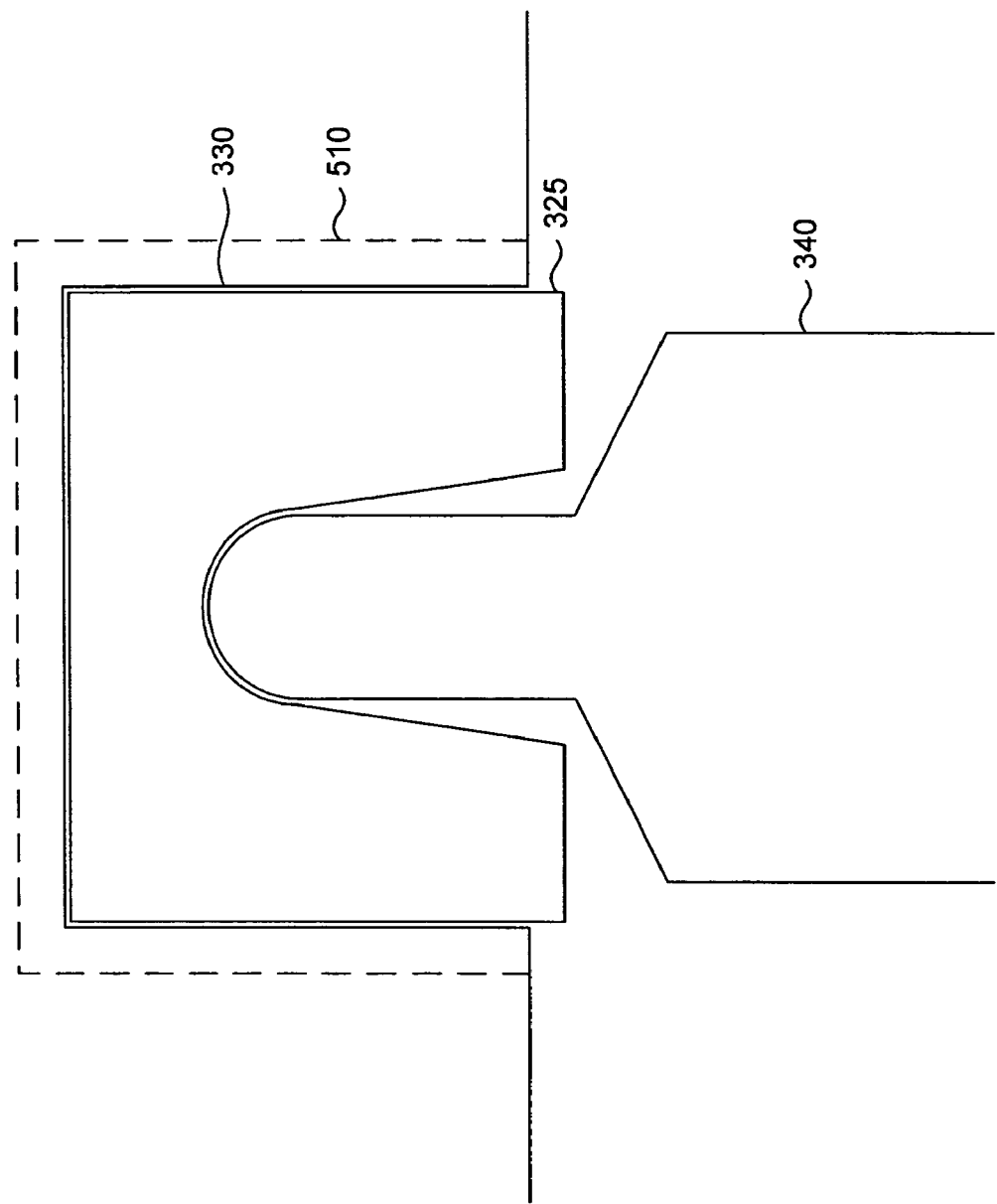
FIG. 5 is a diagram of a mounting pin within a jewel bearing within a bearing hole in a mirror substrate, according to an embodiment of the invention.

FIG. 5 shows a cross sectional view of pin 340 within jewel bearing 325, according to an embodiment of the invention. As described with respect to FIG. 4, jewel bearing 325 can be pressed into bearing hole 330 within mirror substrate 310. In an embodiment, pin 340 has a rounded surface. Similarly the inner surface of jewel bearing 325 is rounded to allow smooth movement of an active faceted mirror device. FIG. 5 illustrates an alternative embodiment in which groove 510 has been made in mirror substrate 310. Groove 510 provides a way for a release of gas or condensation that might otherwise be trapped between bearing hole 330 of mirror substrate 310 and jewel bearing 325. The size of the groove is sufficiently small so as not to impair the positioning control of mirror substrate 310, while being sufficiently large enough to allow gas or moisture to escape. A wide range of groove configurations and groove dimensions will be known to individuals skilled in the relevant arts based on the teachings herein.

Figure 6:
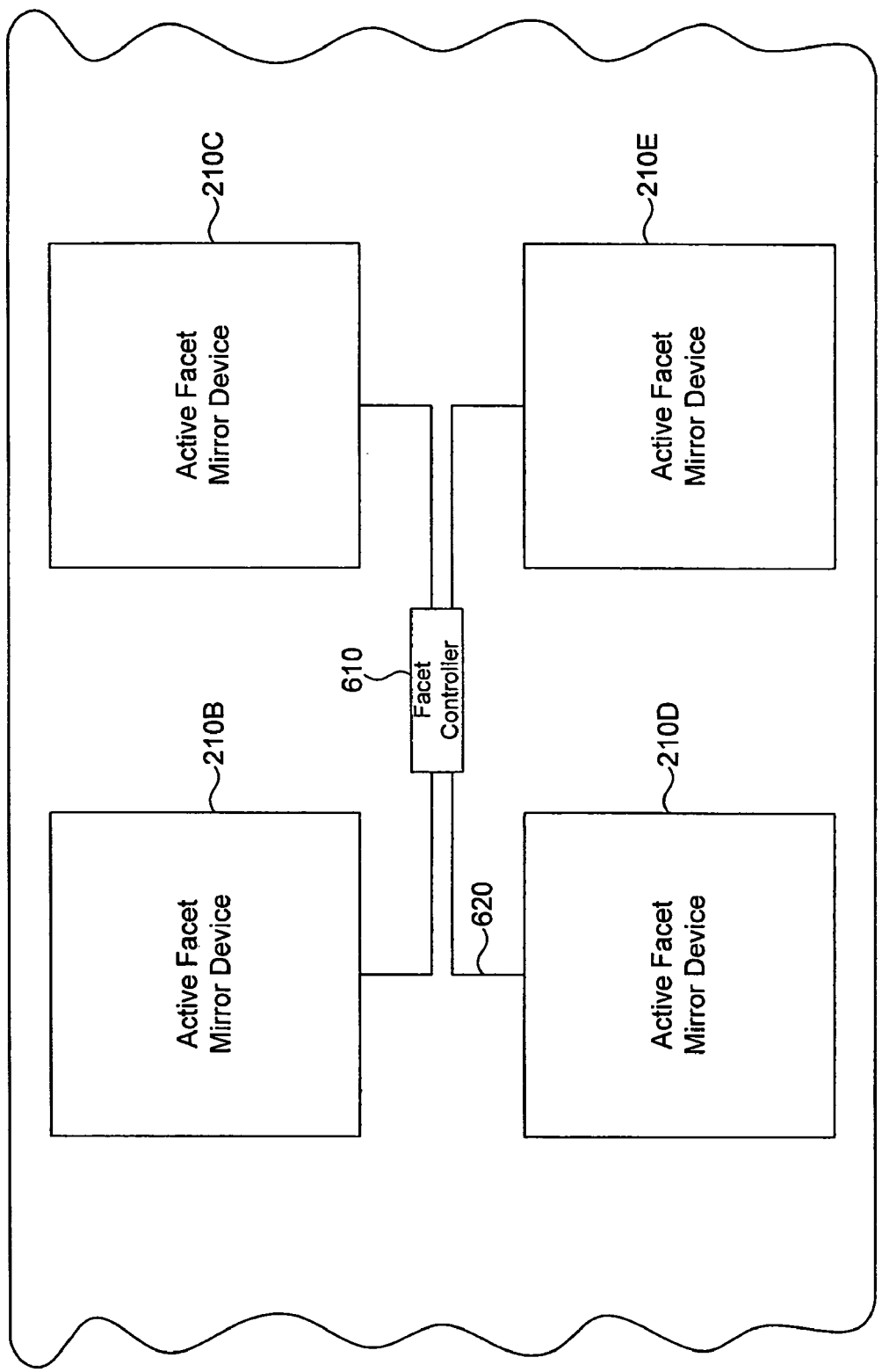
FIG. 6 is a diagram of a set of active facet mirror devices controlled by an actuator controller, according to an embodiment of the invention.

FIG. 6 provides a diagram of a set of active facet mirror devices controlled by a facet controller, according to an embodiment of the invention. Referring back to FIG. 2, FIG. 6 shows a set of active facet mirror devices including active facet mirror devices 210B, 210C, 210D, and 210E. As discussed with respect to FIG. 2, these active facet mirror devices are affixed to base plate 205. Control of the position of the facets can occur in a variety of ways. In general a tilt arrangement of a reflective surface can be configured by a control signal generated by a facet controller. In an embodiment the motion of the reflective surface can be constrained to two directions direction.

In one embodiment (not shown), an external controller can be used to control all actuators for all active facet mirror devices. When an external controller is used, each actuator must be coupled to an external controller. Coupling can include electric leads or wires, optical connections, wireless or electron channels.

FIG. 6 depicts an alternative approach in which internal facet controllers, such as facet controller 610, are used. In this embodiment, facet controller 610 is affixed to or embedded within base plate 205 among the active facet mirror devices to support a set of active facet mirror devices. For example, facet controller 610 controls active facet mirror devices 210B, 210C, 210D, and 210E. The number of active facet mirror devices supported by a facet controller can vary with a typical number being in the range of four to sixteen. This range is exemplary and not intended to limit the invention.

Electrical connections, such as electrical connection 620 extend from facet controller 610 to each actuator for all active facet mirror devices supported by facet controller 610. In other embodiments, optical, wireless or electron channel coupling can be used. By using an internal facet controller, such as facet controller 610, wiring arrangements can be simplified. Each facet controller can then be controlled by a master controller that provides positioning instructions to each facet controller.

This control allows each of the active facet mirror devices to be controlled to provide a specific illumination field. Specifically, active facetted mirror system 200 can redirect electromagnetic radiation to form an illumination field having an adjustable shape with an adjustable radiant intensity based on control signals provided by the facet controllers to each of the active faceted mirror devices. The illumination fields can include, but are not limited to, annular, quadrapole, top hat and top hat with varied sigmas.

Figure 7:
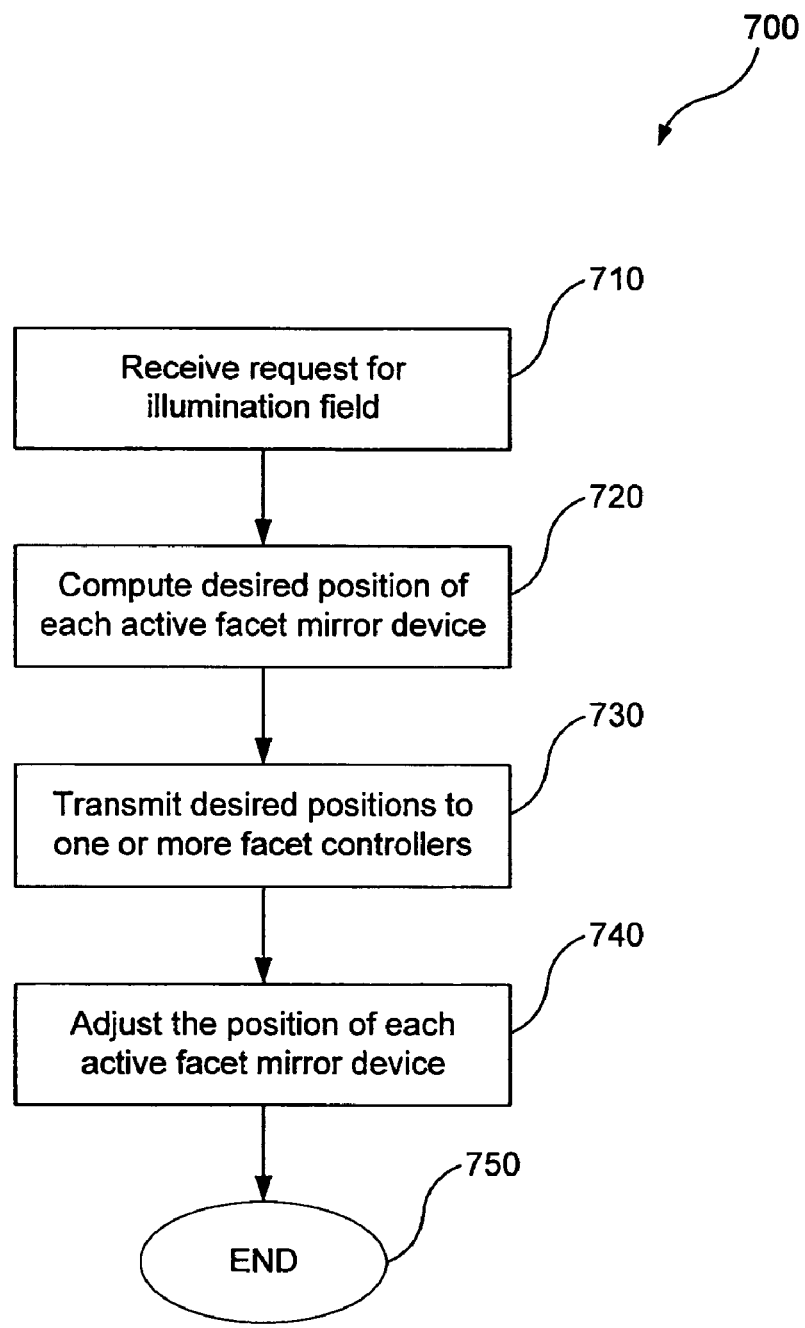
FIG. 7 is a flowchart of a method for adjusting an illumination field within a lithographic tool using one or more active faceted mirror systems, according to an embodiment of the invention.

FIG. 7 provides a flowchart of method 700 for adjusting an illumination field within an illumination system that includes one or more active faceted mirror systems, such as active faceted mirror system 200, according to an embodiment of the invention.

Method 700 begins in step 710. In step 710 a master controller receives a request for a type of illumination field. In step 720 the master controller computes a desired position for each active faceted mirror device within an active facetted mirror system, such as active faceted mirror system 200, based on the requested illumination field. Alternatively, a master controller looks up a table of precomputed positions for the individual mirrors corresponding to the desired illumination field. In step 730 the master controller transmits the desired positions to each of the facet controllers, such as facet controller 610. In step 740 the facet controllers would then adjust the position of each of the active facet mirror devices based on the desired positioning information. In an alternate embodiment, a master controller can control multiple active faceted mirror systems, such as if active faceted mirror system 200 was used for field facet mirror 110 and pupil facet mirror 130 in illumination system 100. The master controller would then be programmed to instruct facet controllers within both active faceted mirror systems to achieve the illumination field or other effect that is desired.

CONCLUSION

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

What is claimed is:

1. An active faceted mirror system, comprising:
   a plurality of active facet mirror devices, wherein each active facet mirror device comprises
      a mirror substrate that includes a mirror substrate bearing hole located on the backside of said mirror substrate;
      a reflective surface placed on the front side of said mirror substrate;
      at least two actuator targets located on the back side of said mirror substrate; and
   a base plate for mounting said plurality of active facet mirror devices, wherein said base plate comprises
      at least two actuators corresponding to said at least two actuator targets for each of said plurality of active facet mirror devices for positioning said mirror substrate;
      a plurality of base plate bearing holes;
   a means for supporting of said mirror substrate, wherein said support means is connected to said mirror substrate and said base plate; and
   a plurality of pins that mount each of said plurality of active facet mirror devices, wherein a pin within said plurality of pins is positioned within each of said plurality of base plate bearing holes and a corresponding mirror substrate bearing hole of said plurality of mirror substrate bearing holes, wherein each of said mirror substrate bearing holes includes a groove or each pin within said plurality of pins includes a groove, wherein the grooves prevent liquid or gas from being trapped.

2. The active faceted mirror system of claim 1, wherein said reflective surface is extreme ultraviolet reflective surface coating.

3. The active faceted mirror system of claim 1, further comprising:
   a plurality of facet controllers mounted on said base plate, wherein each of said plurality of facet controllers controls a subset of said plurality of active facet mirror devices.

4. The active faceted mirror system of claim 1, wherein said at least two actuators are magnetic actuators.

5. The active faceted mirror system of claim 1, wherein said at least two actuators are Lorentz actuators.

6. The active faceted mirror system of claim 1, wherein said mirror substrate comprises a material that dissipates heat away from a front surface of said mirror substrate.

7. The active faceted mirror system of claim 1, wherein said mirror substrate is silver.

8. The active faceted mirror system of claim 1, wherein said reflective surfaces have an arcuate shape.

9. The active faceted mirror system of claim 1, wherein said reflective surfaces have a rectangular shape.

10. The active faceted mirror system of claim 1, wherein the motion of each of the the active facet mirror devices is constrained in two directions.

11. The active faceted mirror system of claim 1, wherein said mirror substrate bearing hole is a hole in the corresponding mirror substrate, wherein said mirror substrate bearing hole includes a bearing.

12. The active faceted mirror system of claim 1, wherein said mirror substrate bearing hole is a bearing surface affixed to the corresponding mirror substrate.

13. The active faceted mirror system of claim 1, wherein said mirror substrate bearing hole is a bearing surface directly on the corresponding mirror substrate.

14. The active faceted mirror system of claim 1, wherein said means for supporting of said mirror substrate is a flexure.

15. The active faceted mirror system of claim 1, wherein said means for supporting of said mirror substrate is at least one return spring.

16. The active faceted mirror system of claim 3, wherein a tilt arrangement of each of the active facet mirror devices can be configured by a control signal generated by said facet controller.

17. The active faceted mirror system of claim 3, wherein said active facet mirror device redirects electromagnetic radiation to form an illumination field having an adjustable shape with an adjustable radiant intensity based on control signals provided by said facet controllers.

18. The active faceted mirror system of claim 17, wherein the illumination field is annular.

19. The active faceted mirror system of claim 17, wherein the illumination field is quadrapole.

20. The active faceted mirror system of claim 17, wherein the illumination field is a top hat.

21. The active faceted mirror system of claim 17, wherein the sigma of the top hat illumination field can be varied.

* * * * *

UNITED STATES PATENT AND TRADEMARK OFFICE
CERTIFICATE OF CORRECTION

| | | |
|---|---|---|
| PATENT NO. | : 7,136,214 B2 | Page 1 of 1 |
| APPLICATION NO. | : 10/986076 | |
| DATED | : November 14, 2006 | |
| INVENTOR(S) | : Erik Loopstra | |

It is certified that error appears in the above-identified patent and that said Letters Patent is hereby corrected as shown below:

In column 9, line 15, "each of the the active facet" should be replaced with --each of the active facet--.

Signed and Sealed this

Thirteenth Day of February, 2007

JON W. DUDAS
*Director of the United States Patent and Trademark Office*